(12) United States Patent
Iwashima et al.

(10) Patent No.: US 8,801,423 B2
(45) Date of Patent: Aug. 12, 2014

(54) PATTERN FORMING METHOD AND PATTERN FORMING APPARATUS

(75) Inventors: Masanobu Iwashima, Kyoto (JP); Masakazu Sanada, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 0 days.

(21) Appl. No.: 13/349,291

(22) Filed: Jan. 12, 2012

(65) Prior Publication Data

US 2012/0242008 A1 Sep. 27, 2012

(30) Foreign Application Priority Data

Mar. 25, 2011 (JP) ................................. 2011-067041

(51) Int. Cl.
*B29C 41/02* (2006.01)
(52) U.S. Cl.
USPC ........ 425/375; 425/150; 425/174.4; 264/241; 264/294; 264/299; 264/308
(58) Field of Classification Search
USPC .............. 425/174.4, 375, 150; 264/241, 294, 264/299, 308
See application file for complete search history.

(56) References Cited

U.S. PATENT DOCUMENTS

2002/0039624 A1* 4/2002 Yabe ............................. 445/23
2008/0220682 A1* 9/2008 Yabe et al. .................... 427/510

FOREIGN PATENT DOCUMENTS

| JP | 2008-091177 A | 4/2008 |
| JP | 2010-278225 | 12/2010 |
| JP | 2011-005404 A | 1/2011 |

OTHER PUBLICATIONS

Korean Office Action issued in Korean Patent Application No. 10-2011-0112850 dated Dec. 12, 2012.

* cited by examiner

*Primary Examiner* — Joseph S Del Sole
*Assistant Examiner* — Lawrence D Hohenbrink, Jr.
(74) *Attorney, Agent, or Firm* — McDermott Will & Emery LLP

(57) ABSTRACT

A nozzle N which moves in a scan direction Ds along a surface Wf of a substrate W discharges an application liquid which contains a photo-curing material, and a light emitter E moving as if to follow the nozzle N irradiates light (UV light for instance) upon the application liquid. Arriving at an application end position, the nozzle N stops discharging the application liquid and retracts in a direction away from the substrate surface Wf. Meanwhile, the light emitter E keeps moving in the scan direction Ds, thereby irradiating even the terminating end of the application liquid with the light without fail.

6 Claims, 9 Drawing Sheets

BEFORE START OF APPLICATION

IMMEDIATELY AFTER START OF APPLICATION

FIG. 1A  BEFORE START OF APPLICATION
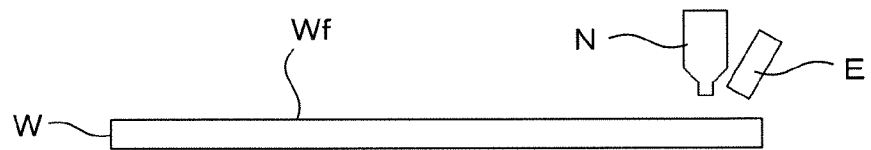
FIG. 1B  IMMEDIATELY AFTER START OF APPLICATION
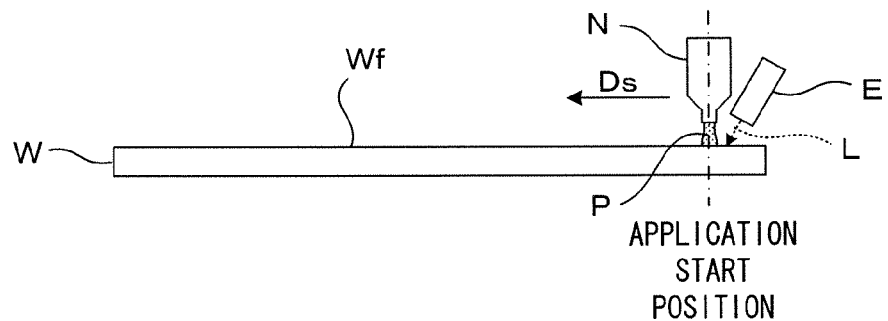
FIG. 1C  DURING SCAN MOVEMENT
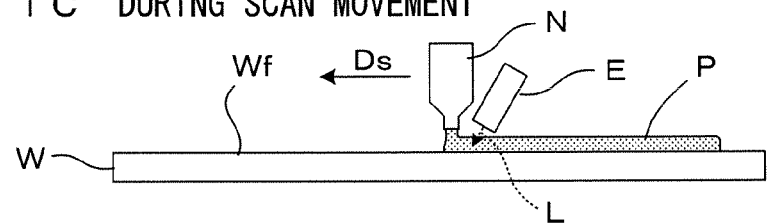
FIG. 1D  ARRIVING AT APPLICATION END POSITION
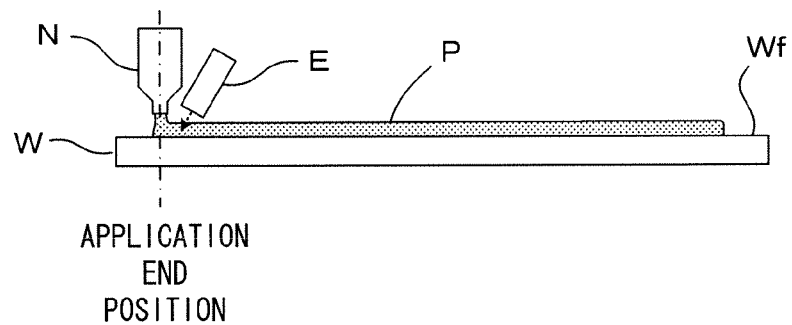

FIG. 2A  TAKE AWAY NOZZLE
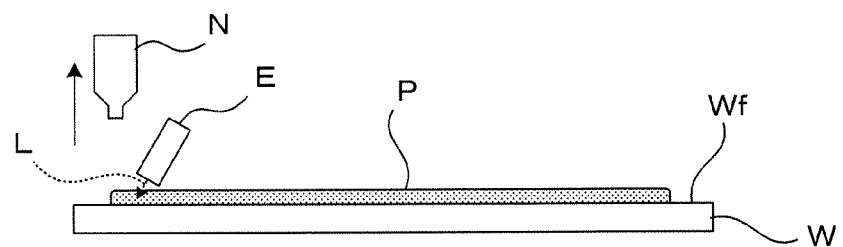
FIG. 2B  SCAN MOVEMENT OF LIGHT EMITTER
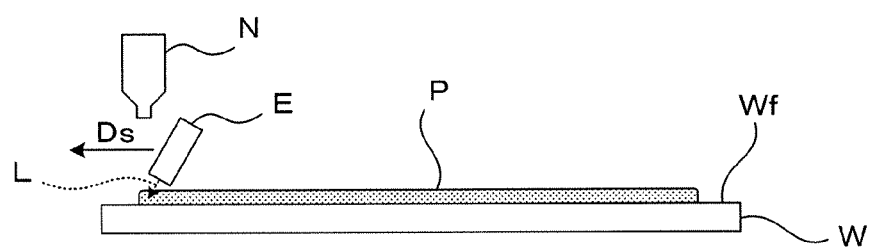
FIG. 2C  FINISH OF PROCESS
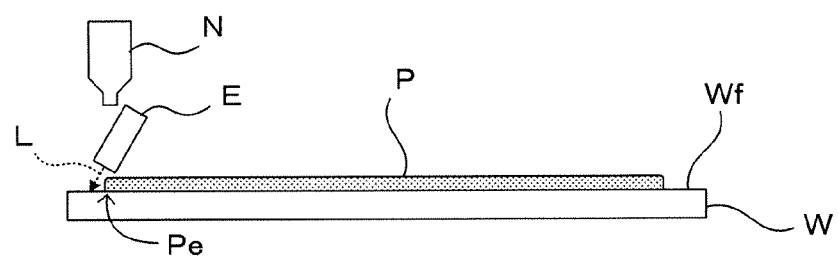

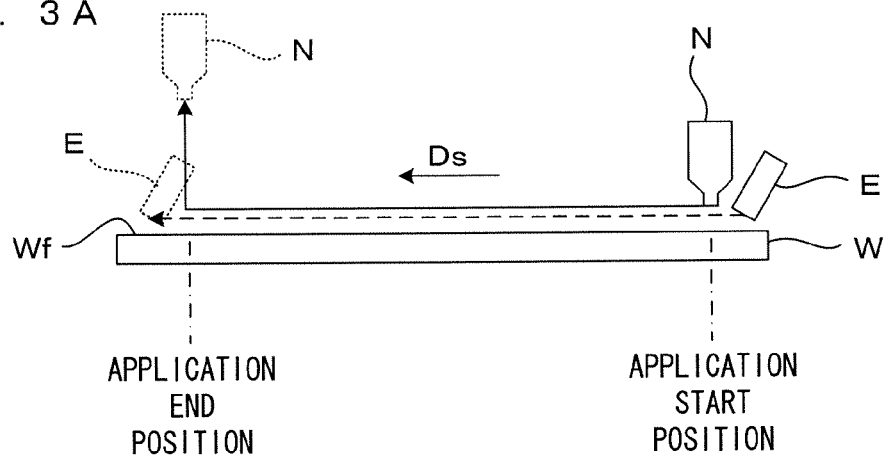
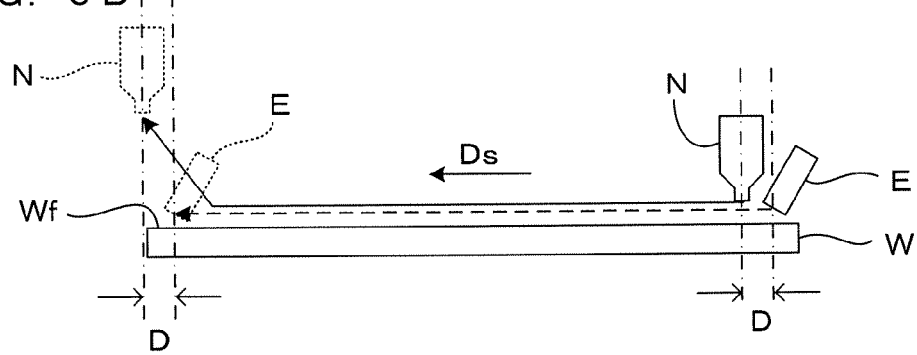
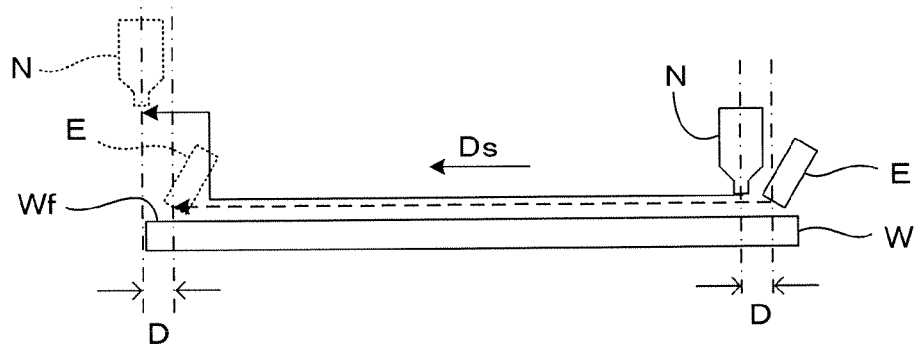

F I G. 6
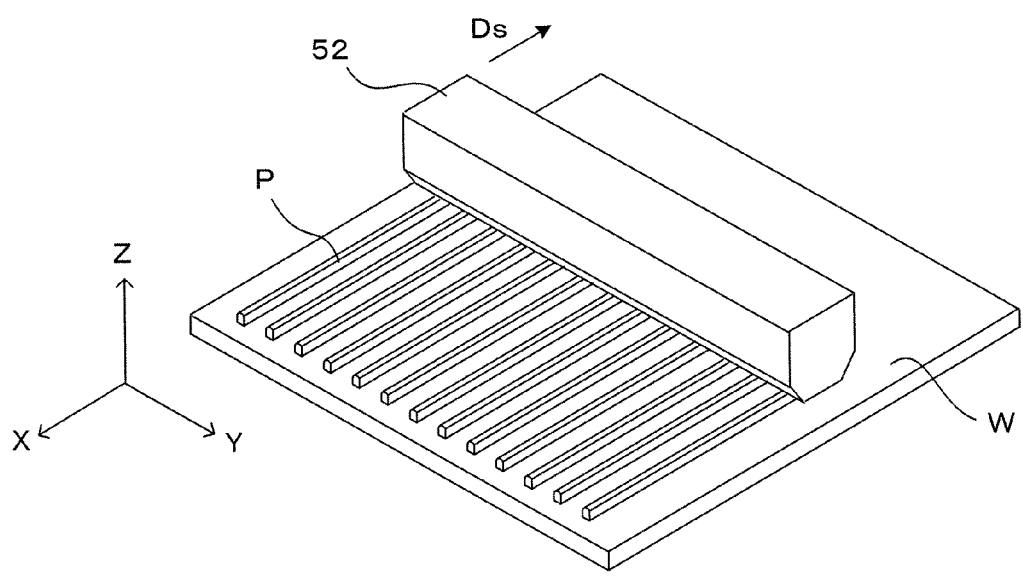

F I G. 9 A
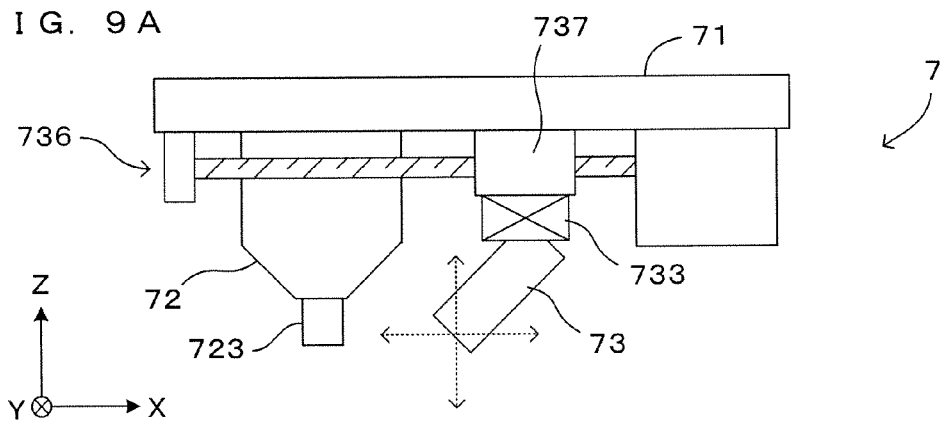
F I G. 9 B
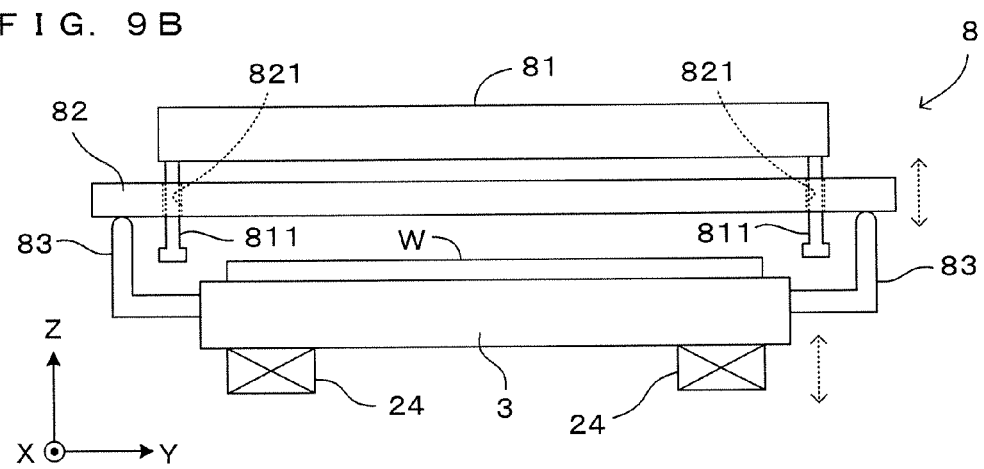

PATTERN FORMING METHOD AND PATTERN FORMING APPARATUS

CROSS REFERENCE TO RELATED APPLICATION

The disclosure of Japanese Patent Application No. 2011-067041 filed on Mar. 25, 2011 including specification, drawings and claims is incorporated herein by reference in its entirety.

BACKGROUND OF THE INVENTION

1. Field of the Invention

The present invention relates to a pattern forming technique for applying an application liquid containing a photo-curing material from a nozzle which moves relative to a substrate surface and irradiating light upon the application liquid to thereby form a pattern on the substrate.

2. Description of the Related Art

To form a predetermined pattern on a substrate surface, there is known a technology which requires applying an application liquid containing a photo-curing material in accordance with the shape of a pattern and irradiating the application liquid with light (which for instance may be UV light) to thereby cure the application liquid. For instance, according to the technique described in JP2010-278225A which the applicant of the present patent application has previously disclosed, the technique above is used to form a wiring pattern in a surface of a photoelectric conversion device (i.e., a solar cell). Describing in more particular details, according to this technique, an application liquid which contains a photo-curing resin is supplied to a surface of a substrate from a nozzle which moves relative to the substrate, the application liquid is irradiated with UV light and accordingly hardened, and banks for running a wiring material are formed. As the wiring material which is a liquid material is allowed to run in a groove which is defined between the banks thus formed, a wiring pattern having a high aspect ratio is formed in the substrate surface.

However, those techniques which utilize application of an application liquid and irradiation of the application liquid with light to form a pattern have the following problems. That is, irradiating with light of the liquid as it has just been discharged from the nozzle is effective in order to harden the application liquid applied onto the substrate while maintaining the shape of the application liquid. If light is irradiated at a position immediately close to the nozzle however, the irradiation light could potentially cure and affix the application liquid around the discharge port of the nozzle and clog the discharge port. If the light is irradiated far from the nozzle in an effort to avoid this problem, the discharged application liquid runs spreading out before getting cured, making it impossible to obtain a desired cross-sectional shape. This problem is particularly apparent when the application liquid has a relatively low viscosity.

If the distance from the nozzle to a light emitter from which the light is irradiated toward the application liquid is long, the light could not sufficiently irradiate the rear end of the coating liquid when discharging of the application liquid from the nozzle has just finished at an application end position, in which case curing becomes inadequate and the shape of the pattern becomes deformed.

With the conventional pattern forming techniques, it is thus difficult to prevent the application liquid from hardening and adhering to the nozzle while at the same time allowing the applied application liquid to harden without fail.

SUMMARY OF THE INVENTION

The invention has been made in light of the problems described above. Accordingly, the object of the invention is to provide a technique, for a pattern forming technique which requires applying an application liquid which contains a photo-curing material to a substrate surface and irradiating the application liquid with light to thereby cure the application liquid and form a pattern on the substrate, which makes it possible to prevent curing and affixing of the application liquid around a nozzle while securely hardening the applied application liquid with the irradiated light.

To achieve above object, the pattern forming method of the present invention comprises the steps of: continuously discharging an application liquid containing a photo-curing material from a discharge port of a nozzle while moving the nozzle along and relative to a surface of a substrate in a predetermined scan direction; and making a light emitter move, as if to follow the nozzle, in the scan direction along and relative to the surface of the substrate and irradiating the application liquid applied onto the substrate with light, thereby photo-curing the photo-curing material, wherein as the position of the nozzle relative to the substrate becomes the same as a predetermined application end position, the discharging of the application liquid from the discharge port is stopped and the nozzle moves in a direction away from the surface of the substrate, and after the nozzle moves away, the light emitter moves relative to the substrate in the scan direction, whereby light irradiates even a terminating end of the application liquid which is terminated by the discontinued discharging from the discharge port.

With this structure according to the invention, as the nozzle which discharges the application liquid moves relative to but away from the surface of the substrate as soon as finishing the discharging at the application end position, the nozzle is securely isolated from the application liquid applied onto the surface of the substrate. As the light emitter further moves in the scan direction in a relative fashion, even when the application liquid on the substrate still has a yet-to-be-irradiated area which has not been irradiated at the time of discontinuation of the discharging, it is possible to irradiate even this area with the light and harden this area. At this stage, since the nozzle has already retracted to a position far away from the surface of the substrate, the light is prevented from irradiating and accordingly curing the application liquid around the discharge port of the nozzle.

According to the invention, it is thus possible to irradiate the applied application liquid with the light without fail and harden the application liquid while preventing the application liquid from hardening and adhering to the nozzle and a surrounding area, to thereby form a pattern into a desired shape. Further, since it is possible to irradiate the light upon the application liquid on the substrate with the light emitter still moving even after the nozzle has retracted back, it is not necessary to dispose the nozzle and the light emitter close to each other despite the inconvenience, which in turn permits to effectively prevent the application liquid from hardening and adhering to the nozzle and the surrounding area.

Further, to achieve the above object, the pattern forming apparatus comprises: a substrate holder which holds a substrate; a nozzle which has a discharge port which is capable of continuously discharging an application liquid which contains a photo-curing material; a light emitter which emits light toward the application liquid discharged from the discharge port; and a moving mechanism which moves the nozzle in a predetermined scan direction along and relative to a surface of the substrate which is held by the substrate holder while moving the light emitter, as if to follow the nozzle, along and relative to the surface of the substrate in the scan direction, wherein as the nozzle which is moved by the moving mechanism relative to the substrate arrives at a predetermined application end position, the nozzle stops discharging of the application liquid from the discharge port and the moving mechanism moves the nozzle in a direction away from the surface of the substrate, and after the nozzle moves away, the moving mechanism moves the light emitter relative to the substrate in the scan direction, whereby the light emitter irradiates light even a terminating end of the application liquid which is terminated by the discontinued discharging from the discharge port.

This apparatus structure according to the invention is preferable to implementation of the pattern forming method described above. This structure attains a similar effect to that realized by the pattern forming method according to the invention. In other words, it is possible according to the invention to irradiate light securely upon the applied application liquid, harden the application liquid and form a pattern in a desired shape while preventing hardening and adhesion of the application liquid around the nozzle.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIGS. 1A through 1D and 2A through 2C are drawings which schematically show processing required by the pattern forming method according to the invention;

FIGS. 3A through 3C are drawing which show the trajectories of the nozzle and the light emitter in this process;

FIG. 6 is a drawing which schematically shows application of a material by the syringe pump;

FIGS. 9A and 9B are drawings which show the pattern forming apparatus according to other embodiment of the invention.

DETAILED DESCRIPTION OF THE PREFERRED EMBODIMENTS

Figure 4:
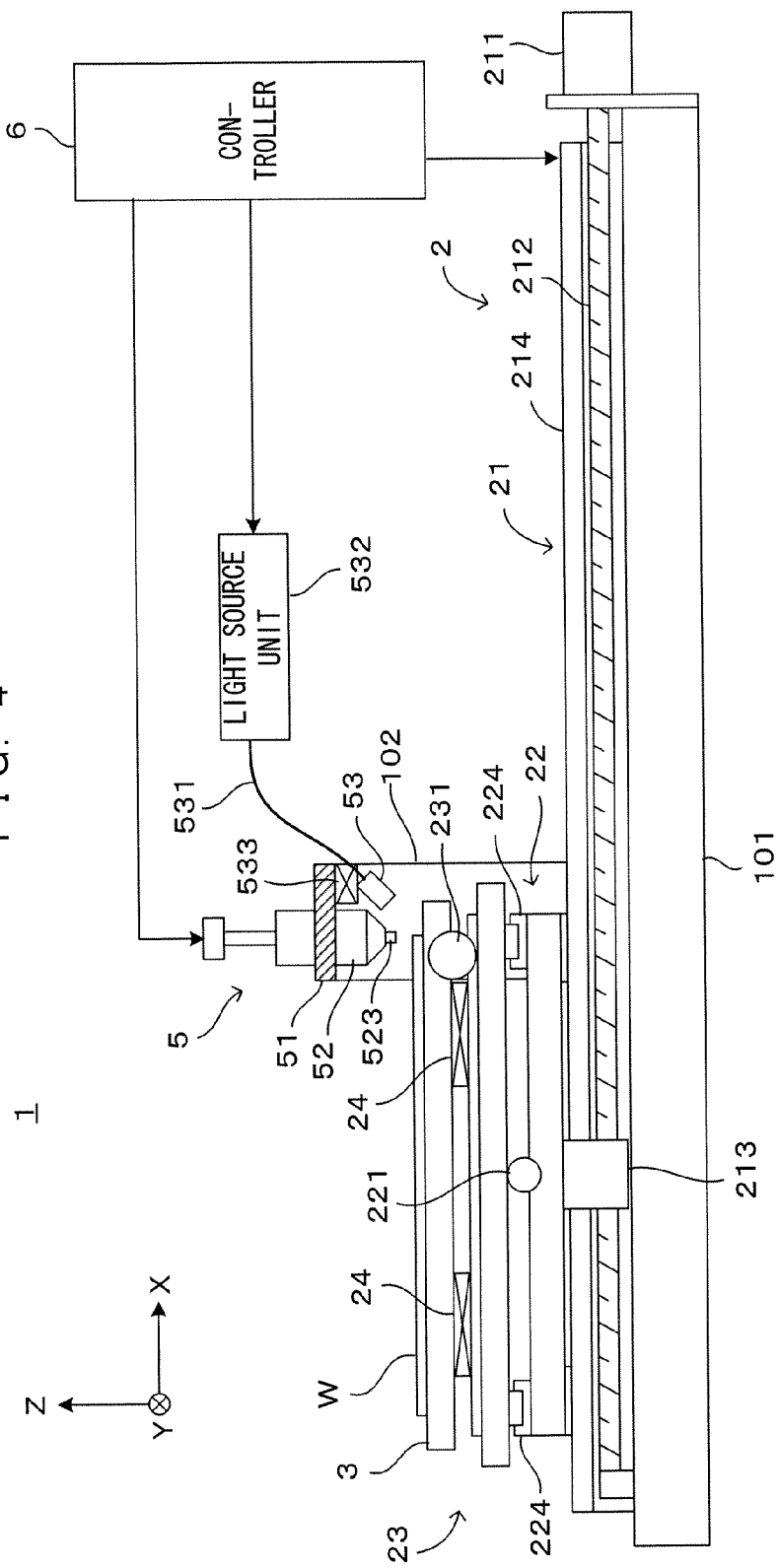
FIG. 4 is a drawing which shows a pattern forming apparatus according to an embodiment of the invention.

The principle of the pattern forming method according to the invention will now be described with reference to FIGS. 1A through 1D, 2A through 2C and 3A through 3C. The pattern forming method according to the invention requires moving the nozzle, which discharges an application liquid containing a photo-curing pattern material, and a light emitter, which irradiates the application liquid with light, relative to a substrate, which is mounted approximately horizontally on a stage, along a surface of the substrate to thereby form a pattern which results from curing of the application liquid on the surface of the substrate. While the relative movement of the nozzle and the light emitter to the substrate can be realized either by moving the nozzle and the light emitter or by moving the substrate, for the purpose of describing the principle of the invention in an easy-to-follow manner, it is heretofore assumed that the substrate is fixed while the nozzle and the light emitter are moved.

FIGS. 1A through 1D and 2A through 2C are drawings which schematically show processing required by the pattern forming method according to the invention. Prior to the start of application of the application liquid, as shown in FIG. 1A, the nozzle N, which is capable of discharging the application liquid at its lower-end discharge port, and the light emitter E, which emits light such as UV (ultraviolet) light at its bottom end, are disposed above one of the end sections of a surface Wf of the substrate W which is held approximately horizontally. The nozzle N then starts discharging the application liquid P and the light emitter E starts emitting light L as shown in FIG. 1B. Approximately at the same time, the nozzle N starts moving in the direction of the arrow Ds, and the light emitter E moves in the arrow direction Ds as if to follow the nozzle N. The nozzle N and the light emitter E move jointly together in the arrow direction Ds relative to the substrate W. Therefore, as the application liquid P containing the photo-curing material is applied upon the surface Wf of the substrate W, the UV light L irradiates the application liquid P which has just been applied upon the substrate surface Wf and the application liquid P hardens under the light.

As shown in FIG. 1C, as the nozzle N moves while continuously discharging the application liquid P and the light L from the light emitter E which moves following the nozzle N irradiates the application liquid P, a line-like pattern resulting from curing of the application liquid is formed on the substrate surface Wf.

The following situation shown in FIG. 1D will now be considered wherein the nozzle N has already reached a predetermined application end position which may for instance be in the vicinity of the other end of the substrate W. While the nozzle N stops discharging the application liquid P at the application end position, the problems below arise if the nozzle N stops moving at the same time as the discontinuation of the discharging.

First, even though the nozzle N has stopped discharging the application liquid, there still is the application liquid remaining around the discharge port and this application liquid could drop onto the substrate surface Wf. This could disturb the shape of the pattern such that the pattern becomes thicker than intended at its terminating end. Second, the light from the light emitter E which moves following the nozzle N could fail to irradiate the terminating end of the pattern and the terminating end may be cured only inadequately.

In order to solve the first problem described above, it is effective to quickly move the nozzle N away from the substrate surface Wf approximately at the same time as the discontinuation of the discharging. Meanwhile, a solution to the second problem may be to arrange the nozzle N and the light emitter E close to each other and accordingly to ensure that the position in the substrate surface Wf at which the application liquid from the nozzle N arrives at the substrate becomes very close to the position in the substrate surface Wf at which the light from the light emitter E irradiates.

This however may give rise to a new problem that the application liquid is irradiated with the light in the vicinity of the discharge port of the nozzle N, gets cured around the nozzle and particularly around the discharge port of the nozzle and clogs the nozzle N. This also potentially leads to a phenomenon (which will be referred to as "drawing") that as the nozzle N starts moving away from the substrate surface Wf at the application end position, the application liquid gets hardened as it is drawn thin like a thread by its own surface tension between the nozzle N and the substrate surface Wf.

As described above, the conventional structure wherein the nozzle N and the light emitter E move together as one relative to the substrate W has a problem that the nozzle N and the light emitter E when disposed close to each other tend to easily cause the application liquid to harden and adhere to the nozzle N, whereas when the nozzle N and the light emitter E are disposed far away from each other, irradiation with the light tends to become insufficient at the terminating end of the pattern.

To solve such a problem, the pattern forming method according to the invention requires forming the terminating end of the pattern in the following fashion. That is, as shown in FIG. 2A, upon arrival of the nozzle N at the application end position, the nozzle, as soon as or right after stopping to discharge the application liquid, starts moving away from the substrate surface Wf (i.e., toward above in the example in FIG. 2A). In the meantime, the light emitter E keeps moving in the arrow direction Ds as shown in FIG. 2B, and finishes moving only after irradiating without fail even the terminating end Pe of the application liquid P which has been applied upon the substrate Wf as shown in FIG. 2C.

FIGS. 3A through 3C are drawing which show the trajectories of the nozzle and the light emitter in this process. As denoted at the solid-line arrow in FIG. 3A, the trajectory of the front tip of the discharge port of the nozzle N in the series of process steps according to the pattern forming method is an approximately horizontal line along the substrate surface Wf from the application start position to the application end position, followed by upturn at the application end position. As this ensures quick severance of the nozzle N at the application end position from the application liquid applied upon the substrate, it is possible to prevent a problem of widening of the pattern, drawing of the application liquid, etc.

Meanwhile, as denoted at the broken-line arrow in FIG. 3A, the light emitter E moves in the direction of scan movement (a scan direction) Ds while maintaining a constant gap from the substrate surface Wf, whereby the application liquid applied onto the substrate W is irradiated with the light under a constant irradiation condition from the beginning to the terminating end of the application liquid. It is therefore possible to form the pattern which has a stable cross sectional shape. Further, since the light irradiation covers even the terminating end of the pattern without fail, it is possible to prevent the pattern from hardening inadequately at its terminating end. Hence, it is not necessary to dispose the nozzle N and the light emitter E extremely close to each other, which makes it possible to prevent the application liquid from getting irradiated with the light around the discharge port of the nozzle N, hardening and clogging the nozzle N.

The pattern forming method according to the invention thus makes it possible to prevent the application liquid from hardening and adhering to the nozzle while irradiating the application liquid even to the terminating end of the application liquid and accordingly forming a pattern which has a stable form, which has heretofore been difficult to achieve with the conventional techniques.

The direction in which the nozzle N moves away from the substrate surface Wf after stopping the discharging of the application liquid at the application end position is not limited to the perpendicular direction to the substrate surface Wf shown in FIG. 3A. For example, the nozzle N may retract in a composite direction of movement toward above and movement along the scan direction Ds as denoted at the solid arrows in FIGS. 3B and 3C. In the example in FIG. 3B, the nozzle N moves in the scan direction Ds at the same speed as the speed of the light emitter E while retracting back toward above, while the light emitter E keeps moving in the direction Ds after discontinuing the discharging of the application liquid. In the example in FIG. 3C, after retracted back toward above, the nozzle N moves in the scan direction Ds at the same speed as the speed of the light emitter E. These examples have the following advantage.

A distance D between the nozzle N and the light emitter E in the scan direction Ds at the time that the light emitter E finishes moving, i.e., upon completion of the process is not different from a distance between the two at the start of application of the liquid and during scan movement. Hence, the nozzle N and the light emitter E may be structured such that they move together as one in the scan direction Ds but move in such a manner that their relative positions to each other change only in the direction in which they move close to and away from the substrate surface Wf (which is the vertical direction in this example). A relatively simple structure may therefore be used as the apparatus structure for holding the nozzle N and the light emitter E or moving the nozzle N and the light emitter E relative to the substrate W. A specific structure of the pattern forming apparatus according to an embodiment of the invention considering this will now be described.

According to the description above on the principle, the nozzle N and the light emitter E move while the substrate W stays fixed. However, in the actual process, it is preferable to move the substrate W while maintaining the nozzle N fixed. The reason is because in the structure which requires moving the nozzle N which discharges the application liquid, the movement or discontinuation of the movement of the nozzle N inevitably impacts and vibrates the nozzle N, thereby causing the application liquid to drip down from the nozzle N and leading to deterioration (wiggling) of the linearity of the resulting pattern. In the embodiments described below of the invention, the operations above are attained with the nozzle staying at the unchanged position and with the substrate and the light emitter moving under control.

FIG. 4 is a drawing which shows a pattern forming apparatus according to an embodiment of the invention. The pattern forming apparatus 1 is an apparatus for forming conductive electrode wiring patterns or banks which are used for forming electrodes on the substrate W, such as a single-crystalline silicon wafer, which has in its surface a photoelectric conversion layer, and accordingly manufacturing a photoelectric conversion device which will be used as a solar cell for instance. In this specification, X, Y and Z coordinates are defined as shown in FIG. 4.

In the pattern forming apparatus 1, a stage moving mechanism 2 is provided on a stand 101 so that the stage moving mechanism 2 can move a stage 3 which holds the substrate W within the X-Y plane which is shown in FIG. 4. A frame 102 is mounted to the stand 101, straddling the stage 3. A head part 5 is attached to the frame 102. To a base 51 of the head part 5, a syringe pump 52 which stores a liquefied (or paste-like) application liquid inside and discharges the application liquid onto the substrate W and a light emitter which emits an UV (ultra-violet) light and irradiates the application liquid applied on the substrate W with the light are disposed.

As described in detail below, the syringe pump 52 stores the application liquid which contains an electrode pattern material, and in response to a control command given from a controller 6, the discharge nozzle 523 discharges the application liquid onto the substrate W. The application liquid for forming an electrode wiring pattern may for instance be a paste-like mixture solution of a conductive or photo-curing liquid, e.g., conductive particles, an organic vehicle (which is a mixture of a solvent, a resin, a thickener, etc.) and a photo-polymerization initiator. The conductive particles may for example be silver powder which is a material of an electrode, while the organic vehicle may contain ethylcellulose, which serves as a resin material, and an organic solvent. The application liquid is not limited to a fluid which contains conductive particles: any fluid which contains a material for forming the banks described earlier for instance may be used.

The light emitter 53 is attached to the base 51 via a light emitter elevating/lowering mechanism 533. The light emitter elevating/lowering mechanism 533 moves the light emitter 53 up and down in the vertical direction (the direction Z) using an actuator, such as a piezoelectric element, a ball screw mechanism or a solenoid, which is driven and controlled by the controller 6. As the light emitter elevating/lowering mechanism 533 operates, in this embodiment, the gap from the light emitter 53 to the substrate W can be adjusted.

The light emitter 53 is connected to a light source unit 532 which generates UV light through an optical fiber 531. Although not shown, the light source unit 532 comprises at its light emitting part a shutter which can be opened and closed, and in accordance with whether the shutter is open or closed and to which degree the shutter is opened, the light source unit can control on/off and the amount of emitted light. The controller 6 controls the light source unit 532. The light emitter 53 irradiates UV light upon the application liquid applied onto the substrate W, and the application liquid hardens while maintaining its cross sectional shape as it is immediately after getting applied. The light source unit 532 may be a light source which generates ultraviolet light which uses a high-pressure mercury lamp, a low-pressure mercury lamp, an LED (light emitting diode), etc.

The stage moving mechanism 2 comprises an X-direction moving mechanism 21 for moving the stage 3 in the X-direction, a Y-direction moving mechanism 22 for moving the stage 3 in the Y-direction, and a θ rotation mechanism 23 for rotating the stage 3 about an axis which is directed to the Z-direction. The X-direction moving mechanism 21 has a structure that a ball screw 212 is linked to a motor 211 while a nut 213 fixed to the Y-direction moving mechanism 22 is attached to the ball screw 212. A guide rail 214 is fixed above the ball screw 212. As the motor 211 rotates, the Y-direction moving mechanism 22 smoothly moves together with the nut 213 in the X-direction along the guide rail 214.

The Y-direction moving mechanism 22, too, comprises a motor 221, a ball screw mechanism and a guide rail 224 so that as the motor 221 rotates, the ball screw mechanism makes the θ rotation mechanism 23 move in the Y-direction along the guide rail 224. A motor 231 disposed to the θ rotation mechanism 23 rotates the stage 3 about the axis which is directed toward the Z-direction. The structure described above makes it possible to change the direction of relative movement of the head part 5 to the substrate W and the directions of the head part 5 to the substrate W. A controller 6 controls the respective motors of the stage moving mechanism 2.

A stage elevating/lowering mechanism 24 is disposed between the θ rotation mechanism 23 and the stage 3. In response to a control command from the controller 6, the stage elevating/lowering mechanism 24 moves the stage 3 up or down, whereby the substrate W is positioned at a designated height (which is a position in the Z-direction). The stage elevating/lowering mechanism 24 may be an actuator such as a solenoid and a piezo-electric element, a gear, combined wedges, etc.

Figure 5A:
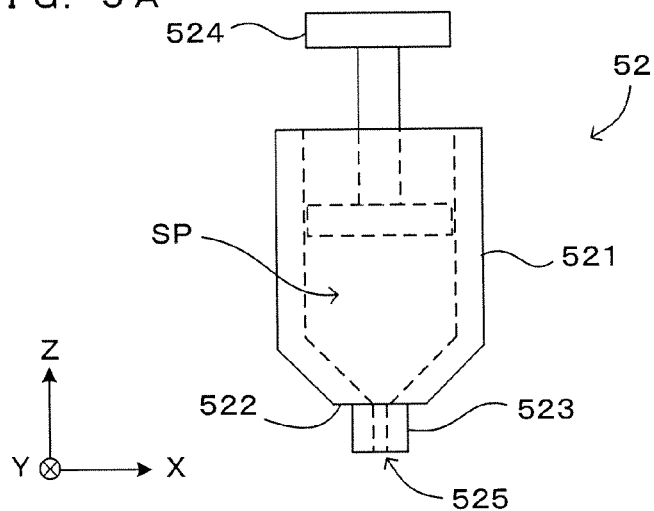
FIGS. 5A through 5C are drawings which show the structure of the syringe pump.
Figure 5B:
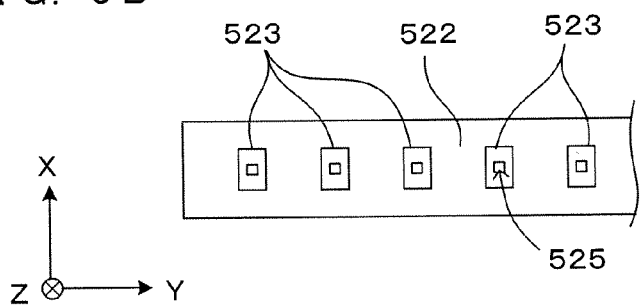
Figure 5C:
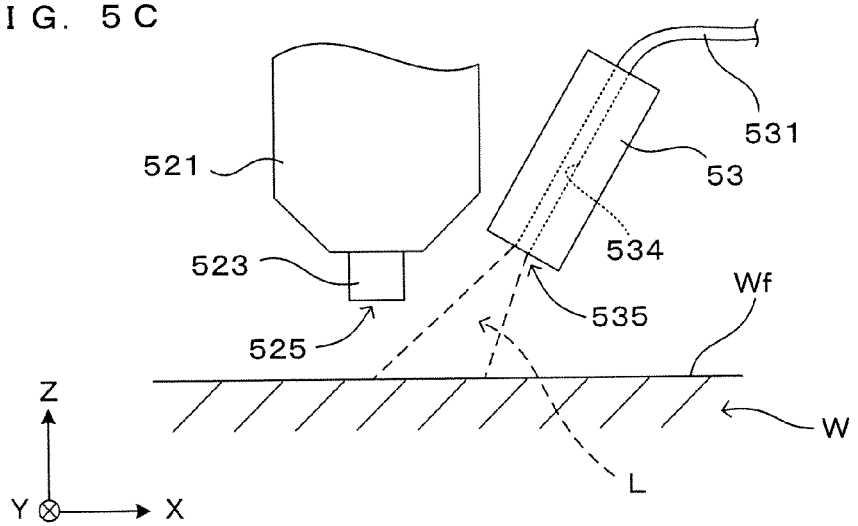

FIGS. 5A through 5C are drawings which show the structure of the syringe pump. Describing more specifically, FIG. 5A is a side view of the internal structure of the syringe pump 52 which is disposed in a head 5, and FIG. 5B is a drawing of the structure of the discharge nozzle which is disposed to the bottom surface of the syringe pump 52. FIG. 5C is a drawing which schematically shows the relationship between the position of the syringe pump 52 and that of the light emitter 53. A housing 521 of the syringe pump 52 is open at the top end toward above, and the bottom end of the housing 521 is hollow linking to the discharge nozzle 523 which is disposed to the bottom surface 522. A plunger 524 which moves up and down in accordance with a control command from the controller 6 is inserted in the opening at the top end of the hollow space.

A space SP inside the housing 521 which is defined by the inner walls of the housing 521 and the plunger 524 stores the application liquid which has a predetermined composition, and as the plunger 524 is pressed down in accordance with a control command from the controller 6, the application liquid is discharged continuously from a discharge port 525 which is open toward below at the bottom end of the discharge nozzle 523 which links to the space SP.

As shown in FIG. 5B, the plurality of discharge nozzles 523 are disposed to the bottom surface 522 of the syringe pump 52 with predetermined spaces from each other in the direction Y. The discharge port 525 of each discharge nozzle 523 is open in an approximately rectangular shape, and each side of the rectangular shape is approximately as long as the line width of the application liquid to be applied. These may be appropriately changed in accordance with the size, the cross sectional shape, the arrangement pitch and the like of a pattern to be formed.

As shown in FIG. 5C, the light emitter 53 is disposed in the vicinity of the discharge nozzle 523. The light emitter 53 is formed by shaving a metal block of stainless steel for instance, and has a through hole 534 which accepts an optical fiber 531. Inserted in the through hole 534, the optical fiber 531 has its end surface exposed in an opening 535 of the bottom surface of the light emitter 53. In such a structure, UV light generated by the light source unit 532 is emitted via the optical fiber 531 toward the surface Wf of the substrate W. For the purpose of irradiating the liquid which has just been discharged with light, the direction in which the light L is thus emitted is set so that the light does not irradiate the discharge port 525 of the discharge nozzle 523 while yet being directed toward the substrate surface Wf which is immediately beneath the discharge nozzle 523.

Since the light L from the light emitter 53 spreads outwards as shown in FIG. 5C, it is difficult to uniformly define a condition "which ensures that the discharge port 525 is not irradiated with light." Practically however, when the intensity of the light at the opening end of the discharge port 525 is smaller than 1/e (where e denotes the base of a natural logarithm) of the intensity of the light at the center of the optical axis, that situation can be deemed to be the same as "not irradiated with light." With the intensity of the irradiation light L at the discharge 525 reduced sufficiently small, it is possible to prevent the application liquid from hardening and adhering to the discharge port 525 and the surrounding area and thereby clogging the nozzle.

FIG. 6 is a drawing which schematically shows application of a material by the syringe pump 52. In the pattern forming apparatus 1, as the controller 6 operates in accordance with a control program created in advance, the discharge nozzles 523 discharge at their discharge ports 525 the application liquid P while the substrate W mounted on the stage 3 is moved horizontally within the XY plane, predetermined line patterns are formed on the substrate W. With the plurality of discharge ports 525 lined up side by side in the direction Y, it is possible to form a plurality of line patterns which are parallel to each other yet isolated from each other in the direction Y as a result of one scanning movement. The direction in which the discharge nozzles 523 move relative to the stage 3 when the stage 3 moves in the direction (+X), i.e., the direction (−X) will hereinafter defined as the scan direction Ds in which the syringe pump 52 and the discharge nozzles 523 move.

The pattern forming apparatus 1 which has the structure described above is capable of forming a number of line patterns which are thin and parallel to each other by the application liquid discharged onto the substrate W. In addition, since the application liquid as it is immediately after applied is cured under irradiation with light, the application liquid keeps its cross sectional shape as it is immediately after applied. Hence, with the shape of the openings of the discharge ports 525 appropriately chosen, it is possible to form a pattern having a high aspect ratio, namely, the ratio of the height to the width.

Figure 7:
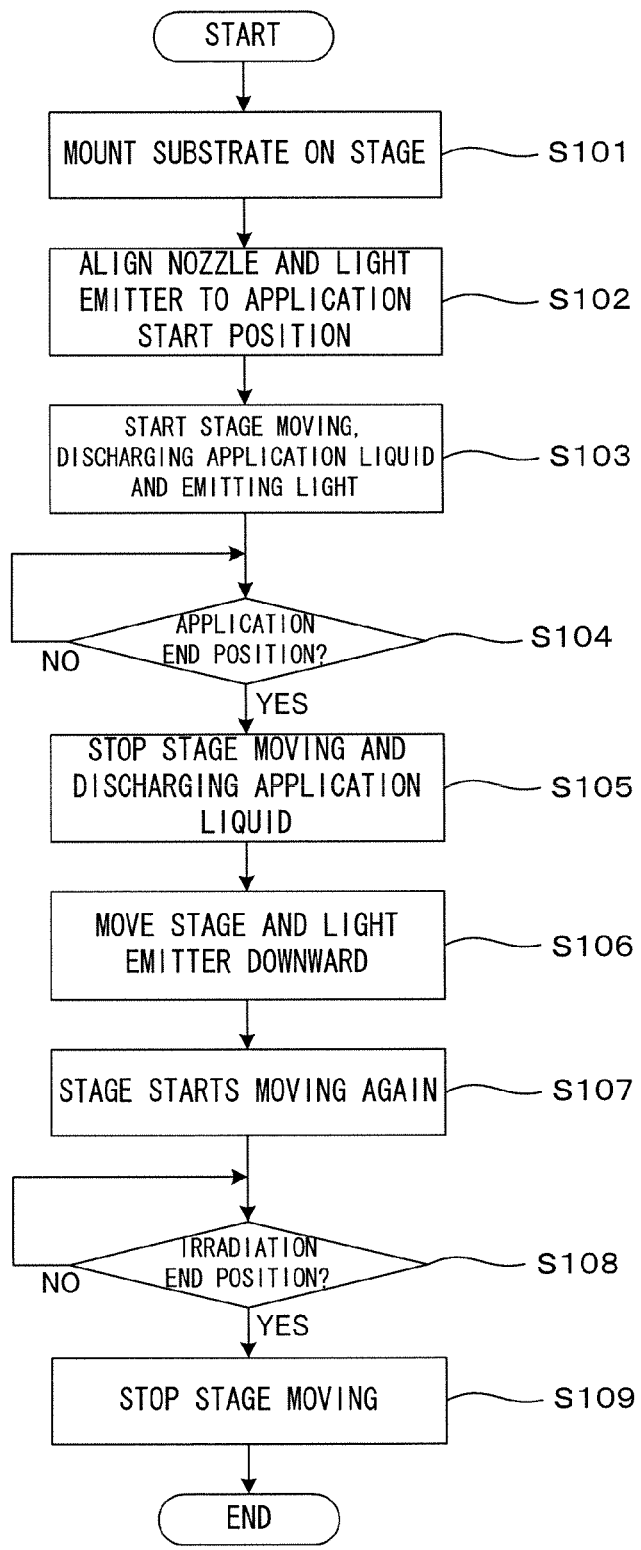
FIG. 7 is a flow chart which shows an example of the pattern forming processing executed in the apparatus shown in FIG. 4.
Figure 8:
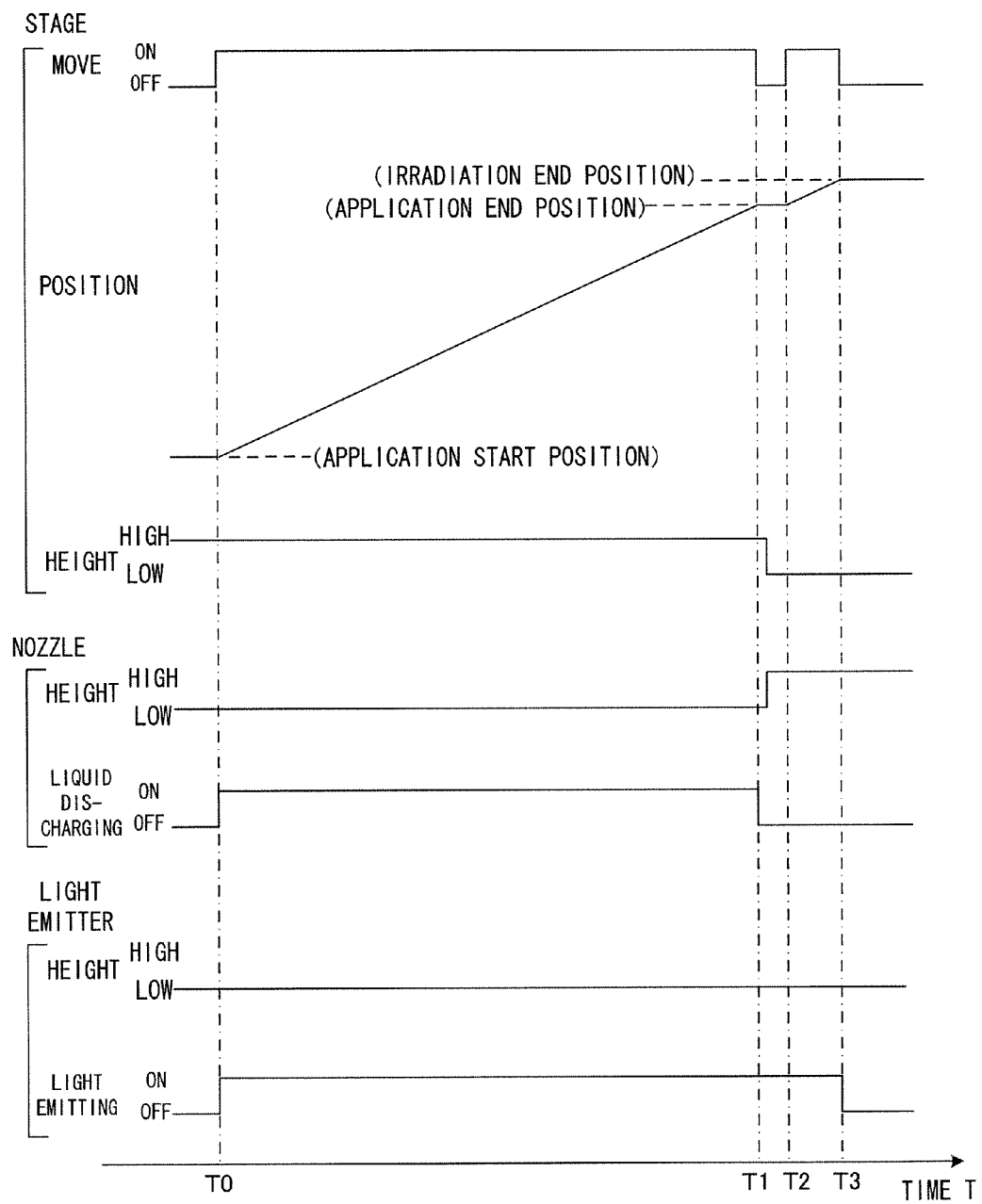
FIG. 8 is a timing chart which shows the operations performed by the respective parts of the apparatus during the processing which is shown in FIG. 7.

FIG. 7 is a flow chart which shows an example of the pattern forming processing executed in the apparatus shown in FIG. 4. FIG. 8 is a timing chart which shows the operations performed by the respective parts of the apparatus during the processing which is shown in FIG. 7. First, the substrate W to be processed is loaded into the pattern forming apparatus 1 described above and mounted on the stage 3 with the surface Wf, which is the pattern forming surface, directed toward above (Step S101). As the stage 3 thereafter moves to an initial position, the relative position of the discharge nozzles 23 and the light emitter 53 to the substrate W is aligned to the predetermined application start position (which is the position shown in FIG. 1A) (Step S102).

From this state, at the time T0 (FIG. 8), driving of the stage 3 is initiated, whereby the substrate W starts moving, and the discharge nozzles 523 start discharging the application liquid while the light emitter 53 starts emitting light (Step S103). As shown in FIG. 8, at the time T0, the stage 3 is located at a relatively higher position by the stage elevating/lowering mechanism 24. Hence, as viewed from the substrate W mounted on the stage 3, the discharge nozzles 523 and the light emitter 53 are located at relatively low positions. That is, the discharge nozzles 523 and the light emitter 53 are close to the substrate surface Wf.

The stage 3 keeps moving at a constant speed while the discharge nozzles 523 continuously discharge a constant amount of the application liquid and the light emitter 53 continuously emits light until the position of the discharge nozzles 523 relative to the stage 3 becomes the same as the predetermined application end position (which is the position shown in FIG. 1D) (Step S104).

Upon arrival of the discharge nozzles 523 at the application end position at the time T1, the discharge nozzles 523 stop discharging the application liquid and the stage 3 stops moving (Step S105). At approximately the same time as or slightly after this, the stage elevating/lowering mechanism 24 moves down the stage 3. As the light emitter elevating/lowering mechanism 533 operates in synchronization to the stage elevating/lowering mechanism 24, the light emitter 53 moves down following the stage 3. The stage 3 and the light emitter 53 are moved downward in this manner (Step S106). As shown in FIG. 8, while the height of the discharge nozzles 523 as viewed from the substrate W changes from the relatively low position to a higher position as the stage 3 moves downward, since the light emitter 53 moves downward following the descending motion of the stage 3, the position of the light emitter 53 as viewed from the substrate W does not change.

In a relative sense, this is the same as having the discharge nozzles 523 retracting toward above relative to the light emitter 53 and the substrate W which is mounted on the stage 3. However, as the discharge nozzles 523 are fixed, it is possible as described above to isolate the application liquid on the substrate W from the discharge nozzles 523 (or more specifically, the discharge ports 525) while preventing dripping of the liquid attributable to vibrations of the nozzles.

It is not an essential requirement to stop moving the stage 3 at the application end position. That is, the stage 3 may keep moving in the direction X while the discharge nozzles 523 stop discharging the application liquid and retract. This makes it possible to prevent the light from irradiating the application liquid P at one point as the stage 3 stops. Considering the purpose of preventing the application liquid from hardening and adhering to the discharge ports 525, it is effective that the stage 3 temporarily stops moving concurrently with discharging of the application liquid and the discharge nozzles 523 then retract, as this can more securely isolate the nozzles from the application liquid on the substrate W.

The stage 3 then starts moving again (Step S107, the time T2) and keeps moving until the light emitter 53 arrives at an irradiation end position which is toward outside than the application end position on the substrate W (Step S108). The light emitter 53 keeps emitting UV light during this. As the light emitter 53 arrives at the irradiation end position at the time T3, the light emitter 53 stops emitting light and the stage 3 stops moving (Step S109). At that point, as shown in FIG. 2C, light irradiates even the terminating end Pe of the application liquid P applied onto the substrate surface Wf and the entire pattern gets cured uniformly. Although the nozzle N stays still at an immediately upright position after arriving at the application end position in the principle diagram in FIG. 2C, in the apparatus which has the structure described above and operates as described above, after retracting toward right above, the discharge nozzles 523 move further in the horizontal directions together with the light emitter 53. In short, the trajectories of the discharge nozzles 523 are as shown in FIG. 3C. In this case, the discharge nozzles 523 have already been isolated from the application liquid on the substrate W and cannot influence the shape of the pattern.

As described above, in the pattern forming apparatus 1 and the pattern forming method using this apparatus according to this embodiment, the discharge nozzles 523 which move relative to the substrate W along the substrate surface Wf discharge the application liquid which contains the photo-curing material and apply the application liquid upon the substrate surface Wf. Concurrently with this, the light emitter 53 which moves in the relative motion along the substrate surface Wf as if to follow the discharge nozzles 523 irradiates UV light, thereby photo-curing the application liquid and forming patterns. It is thus possible to form a pattern which retains the cross sectional shape of the application liquid as it is immediately after applied, which is suitable to the purpose of forming a pattern which for instance has a high aspect ratio, i.e., which is tall relative to the width in cross section.

In the embodiment, the discharge nozzles 523 and the light emitter 53, instead of being completely integrated with each other, have such structures which allow, when needed, a change to the relative relationship in terms of position between the discharge nozzles 523 and the light emitter 53. That is, as the discharge nozzles 523 arrive at the application end position, the discharge nozzles 523 stop discharging the application liquid and retract in the direction away from the substrate surface Wf, whereas the light emitter 53 further moves in a scanning motion as it stays close to the substrate surface Wf. This ensures irradiation of even the terminating end Pe of the application liquid with light and uniformly hardens the patterns as a whole. It is therefore possible to prevent a problem that an insufficient quantity of light irradiation at the terminating end of a pattern leads to inadequate curing.

Further, since the discharge nozzles 523 which have stopped discharging the application liquid had already retracted away from the substrate surface Wf and been isolated from the application liquid on the substrate, it is possible to obviate a problem that the application liquid hardens due to photo-curing and adheres to the discharge ports 525 and surrounding areas or the application liquid gets drawn like a string at the terminating ends of patterns. That is, according to this embodiment, it is possible to prevent hardening and adherence of the application liquid to the nozzles while forming patterns having stable shapes by means of light irradiation of even the terminating ends of the patterns.

As described above, in this embodiment, the discharge nozzles 523 function as "the nozzle" of the invention while the light emitter 53 functions as "the light emitter" of the invention. The stage 3 functions as "the substrate holder" of the invention, and the stage moving mechanism 2 and the light emitter moving mechanism 533 collectively function as "the moving mechanism" of the invention.

The invention is not limited to the embodiments described above but may be modified in various manners in addition to the embodiments above, to the extent not deviating from the object of the invention. For instance, in order to realize the technical concept of the invention that "the light emitter keeps moving in a scan movement while the nozzles, having finished application, move away from the substrate surface," the embodiment above requires that the discharge nozzles 523 is fixed to the base 51 and the light emitter 53 is disposed in such a manner that the elevating/lowering mechanism 533 makes the light emitter 53 elevate and lower relative to the base 51. However, the structure for realizing this concept is not limited to this but may be as described below.

FIGS. 9A and 9B are drawings which show the pattern forming apparatus according to other embodiment of the invention. Describing more specifically, FIG. 9A is a drawing of the head part of the pattern forming apparatus according to the second embodiment of the invention. The head part 7 according to the second embodiment can be mounted to the apparatus shown in FIG. 4, thus replacing the head part 5 disposed in the apparatus according to the first embodiment, and is similar to the first embodiment with respect to the structure that a syringe pump 72 is fixed to a base 71. A light emitter elevating/lowering mechanism 733 which holds a light emitter 73 however is attached to a support block 737 which can move in the direction X owing to a ball screw mechanism 736. The light emitter elevating/lowering mechanism 733 and the ball screw mechanism 736 allow the light emitter 73 to move in the directions of two axes of the axis X and the axis Z, as denoted at the dotted-line arrows in FIG. 9A.

This structure can realize any of the two modes of operation which are shown in FIGS. 3A through 3C. Further, since the ball screw mechanism 736 drives the light emitter 73 after the stage 3 stops and the light emitter 73 can therefore move in the scan direction Ds, it is not necessary for the stage 3 to start moving again. This makes it possible to maintain the movement in the scan direction as for the relation between the light emitter 73 and the substrate W while discontinuing the movement in the scan direction as for the relation between discharge nozzles 723 and the substrate W.

As shown in FIGS. 3A through 3C, noting the movement of the light emitter E, the light emitter E moves merely linearly parallel to the substrate surface Wf. Hence, as long as the light emitter E can follow the nozzle N in the direction along the substrate surface Wf (which is the horizontal direction in the illustrated example) but can follow the substrate W in the direction toward and away from the substrate surface Wf (which is the upright direction in the illustrated example), an active mechanism for driving the light emitter E is not always necessary. The mechanism shown in FIG. 9B for instance makes such an operation possible.

FIG. 9B is a drawing which shows the head part disposed in the pattern forming apparatus according to the third embodiment of the invention. A structure according to this embodiment for allowing the light emitter to move in a desired manner is characteristic, and therefore, the syringe pump disposed to the base 81 will not be described. A support plate 82 is disposed in the head part 8 according to this embodiment, and although not shown, the light emitter is fixed to the bottom surface of the support plate 82. A pair of through holes 821 are bored in the support plate 82, and a pair of regulator pins 811 projecting from the bottom surface of the base 81 are inserted in the through holes 821. This restricts the movement of the support plate 82 in the horizontal directions (namely, the direction X and the direction Y) but permits the support plate 82 to freely move in the vertical direction (the direction Z) within a predetermined range.

A pair of slide rails 83, which are disposed to the side surfaces of the stage 3 so as to extend in the direction X (which is the parallel direction to the direction of scan movement), support the both ends of the bottom surface of the support plate 82 from below for free slide movement. This structure makes it possible for the support plate 82 to stay at a constant position without following the movement of the stage 3 in the direction X but to vertically move following the movement of the stage 3 in the direction Z.

Hence, as the nozzles are fixed to the base 81 and the light emitter is fixed to the support plate 82, it is possible to realize a similar operation to that according to the first embodiment. That is, it is possible to maintain the gap between the substrate and the light emitter constant in the direction toward and away from the substrate while maintaining the gap between the nozzles and the light emitter in the scan direction.

For the purpose of suppressing adhesion of particles which are created as the members slide against each other to the substrate W, it is desirable that the through holes 821, the regulator pins 811 and the slide rails 83 and the like which are for realizing the operation described above are disposed far from positions which are above the substrate W which is mounted on the stage 3 as shown in FIG. 9B.

In addition, while the discharge nozzles 523 and the substrate W move relative to each other in the horizontal directions and the vertical direction as the stage 3 mounting the substrate W moves with the discharge nozzles 523 fixed according to the embodiments above, the discharge nozzles 523 may be moved. However, since the discharged amount changes in the vicinity of the ends of the patterns as described above even with the nozzles fixed, it is not preferable to move or vibrate the nozzles. In this sense, a structure which moves the substrate W as those according to the embodiments described above is more preferable.

Although the wiring patterns are formed only on one side of the substrate W in the above respective embodiments, the present invention can be applied also in the case of forming wiring patterns on both sides of the substrate W. Further, the shape of the substrate and the number of the pattern elements in the above embodiments are only examples, and an application range of the present invention is not limited to these.

Although the solar cell as the photoelectric conversion device is manufactured by forming the electrode wiring pattern elements on the monocrystalline silicon substrate in the above respective embodiments, the substrate is not limited to a silicon substrate. For example, the present invention can be applied also in forming pattern elements on a thin-film solar cell formed on a glass substrate or a device other than the solar cell. In addition, the purpose of a pattern to be formed through applying is not limited in any fashion, and the invention may be applied to any desired purpose.

The invention is particularly favorably applicable to a technique which requires discharging an application liquid containing a photo-curing material onto a substrate and irradiating the application liquid with light to thereby form a predetermined pattern in a stable manner.

Where the pattern forming method of the present invention is used, for instance, once the nozzle has arrived at the application end position, the nozzle may move away from the surface of the substrate after stopping its movement in the scan direction relative to the substrate and discontinuing the discharging of the application liquid at the discharge port. Since the discharging of the application liquid from the discharge port is discontinued with the nozzle movement suspended and the nozzle then moves away, it is possible to prevent the application liquid still remaining around the discharge port from dripping down onto the substrate, to prevent drawing, i.e., the phenomena that the nozzle takes away and draws the terminating end of the application liquid like a thread, and to discourage the shape of the pattern from getting disturbed.

Further, for a period of time since the start of irradiation of the light upon the application liquid until completion of the irradiation upon the terminating end of the application liquid for example, it is preferable to maintain the gap between the light emitter and the surface of the substrate constant. This ensures a uniform condition under which the light is irradiated upon the application liquid, secures constant curing of a pattern and properly controls the shape of the pattern.

Further, for a period of time since the start of irradiation of the light upon the application liquid until the end of the discharging of the application liquid from the discharge port for instance, the gap between the nozzle and the light emitter in the scan direction may be maintained constant. That is, the nozzle and the light emitter may move together as one relative to the substrate during this period of time. Such an operation can be realized using a relatively easy apparatus structure, and when realized, ensures a constant time gap between discharging of the application liquid and irradiation of the light and therefore is effective in controlling the shape of the pattern.

Further, the nozzle may be fixed at a certain position and the substrate may be moved for example in realizing relative movement of the nozzle to the substrate. While any one of the substrate and the nozzle may be moved in order to realize relative movement of the nozzle to the substrate, in the event that the nozzle is fixed and the substrate is moved, it is possible to prevent impact upon and vibration of the nozzle due to the movement from causing the application liquid to drip and a wiggling trajectory of the application liquid.

In the pattern forming apparatus of the invention, the moving mechanism may for instance move the light emitter relative to the substrate in the scan direction while maintaining a constant gap between the light emitter and the surface of the substrate. This secures a uniform condition under which the light is irradiated upon the application liquid, achieves a constant degree of curing of a pattern and properly controls the shape of the pattern.

Further, the moving mechanism may for instance have such a structure so as to move the substrate holder while holding the nozzle at a predetermined fixed position. As the moving mechanism moves the substrate holder in the opposite direction to the scan direction, the nozzle moves relative to the substrate in the scan direction, and once the nozzle's position relative to the substrate becomes the same as the application end position, the moving mechanism may move the substrate holder in the direction away from the nozzle.

Where the substrate is moved while the nozzle is fixed, it is possible as described above to obviate impact upon and vibration of the nozzle from causing dripping of the application liquid and a wiggled trajectory of the application liquid. As the substrate holder moves away from the nozzle after the nozzle has arrived at the application end position, it is possible to prevent without fail the application liquid from dripping from the nozzle or getting drawn thin from the nozzle.

When structured as such, the moving mechanism may support the light emitter and the nozzle together as one in the scan direction, and as for the direction toward and away from the surface of the substrate, the moving mechanism may support the light emitter for free movement relative to the nozzle and may move the light emitter such that the light emitter follows the substrate holder when the substrate holder moves away from the nozzle.

This ensures that the nozzle and the light emitter move together as one relative to the surface of the substrate in the scan direction and the light emitter moves following the substrate holder when the substrate holder moves away from the nozzle. It is therefore possible to maintain a constant gap between the light emitter and the substrate and prevent the light irradiation condition from varying.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A pattern forming apparatus, comprising:
   a substrate holder which holds a substrate;
   a nozzle which has a discharge port which is capable of continuously discharging an application liquid which contains a photo-curing material;
   a light emitter which emits light toward the application liquid discharged from the discharge port,
   wherein the light emitter moves in a vertical direction relative to the nozzle; and
   a moving mechanism which moves the nozzle in a predetermined scan direction along and relative to a surface of the substrate which is held by the substrate holder while moving the light emitter, as if to follow the nozzle, along and relative to the surface of the substrate in the scan direction,
   wherein as the nozzle which is moved by the moving mechanism relative to the substrate arrives at a predetermined application end position, the nozzle stops discharging of the application liquid from the discharge port and the moving mechanism moves the nozzle away from the surface of the substrate in a direction that a gap in the vertical direction between the nozzle and the substrate increases while maintaining a gap in the vertical direction between the light emitter and the surface of the substrate constant, and after the nozzle moves away, the moving mechanism moves the light emitter relative to the substrate in the scan direction, whereby the light emitter irradiates light to a terminating end of the application, liquid which is terminated by the discontinued discharging from the discharge port.

2. The pattern forming apparatus of claim 1, wherein the moving mechanism moves the light emitter relative to the substrate in the scan direction while maintaining the gap in the vertical direction between the light emitter and the surface of the substrate constant.

3. The pattern forming apparatus of claim 1, wherein the moving mechanism moves the substrate holder while keeping the nozzle staying at a predetermined position, and the nozzle moves relative to the substrate in the scan direction as the substrate holder moves in the opposite direction, to the scan direction, and as the relative position of the nozzle to the substrate becomes the same as the application end position, the substrate holder moves in a direction away from the nozzle.

4. The pattern forming apparatus of claim 3, wherein the moving mechanism supports the light emitter and the nozzle together as one in the scan direction but supports the light emitter for free movement relative to the nozzle in the direction toward and away from the surface of the substrate, and when the substrate holder moves in the direction away from the nozzle, the moving mechanism moves the light emitter following the substrate holder.

5. The pattern forming apparatus of claim 1, wherein the substrate is held so that the surface of the substrate extends along a horizontal direction.

6. The pattern forming apparatus of claim 1, wherein the light emitter and the substrate holder move in the vertical direction relative to the nozzle while maintaining the gap in the vertical direction between the light emitter and the substrate constant.

* * * * *